United States Patent
Li (10) Patent No.: US 11,544,838 B2
(45) Date of Patent: Jan. 3, 2023

(54) SYSTEMS AND METHODS OF HIGH-RESOLUTION REVIEW FOR SEMICONDUCTOR INSPECTION IN BACKEND AND WAFER LEVEL PACKAGING

(71) Applicant: KLA Corporation, Milpitas, CA (US)

(72) Inventor: Shifang Li, Pleasanton, CA (US)

(73) Assignee: KLA Corporation, Milpitas, CA (US)

(*) Notice: Subject to any disclaimer, the term of this patent is extended or adjusted under 35 U.S.C. 154(b) by 182 days.

(21) Appl. No.: 16/826,193

(22) Filed: Mar. 21, 2020

(65) Prior Publication Data

US 2021/0295495 A1   Sep. 23, 2021

(51) Int. Cl.
| | |
|---|---|
| G06T 7/00 | (2017.01) |
| G02B 21/33 | (2006.01) |
| G02B 21/14 | (2006.01) |
| H01L 21/67 | (2006.01) |
| G02B 21/36 | (2006.01) |
| G01N 21/88 | (2006.01) |
| G01N 21/95 | (2006.01) |

(52) U.S. Cl.
CPC ....... *G06T 7/0006* (2013.01); *G01N 21/8806* (2013.01); *G01N 21/9501* (2013.01); *G02B 21/14* (2013.01); *G02B 21/33* (2013.01); *G02B 21/367* (2013.01); *H01L 21/67288* (2013.01); *G06T 2207/10152* (2013.01); *G06T 2207/30148* (2013.01)

(58) Field of Classification Search
CPC ...... G02B 21/14; G02B 21/33; G02B 21/367; G02B 21/16; G06T 2207/10152; G06T 2207/30148; G06T 7/0006; H01L 21/67288; G01N 21/8806; G01N 21/9501
USPC ............ 356/356, 237.1–237.6, 239.1–239.8
See application file for complete search history.

(56) References Cited

U.S. PATENT DOCUMENTS

| | | | |
|---|---|---|---|
| 6,222,936 B1 | 4/2001 | Phan et al. | |
| 6,495,818 B1* | 12/2002 | Mao .................... | G01C 11/025 |
| | | | 250/226 |
| 6,566,671 B1 | 5/2003 | Koshida et al. | |
| 7,050,223 B1 | 5/2006 | Hoppen | |
| 7,130,037 B1 | 10/2006 | Lange | |
| 7,436,527 B2 | 10/2008 | Opsal | |
| 8,488,102 B2 | 7/2013 | Yeo et al. | |
| 9,809,898 B2 | 11/2017 | Dinneen et al. | |

(Continued)

FOREIGN PATENT DOCUMENTS

WO    2009149103 A1    12/2009

OTHER PUBLICATIONS

KLA-Tencor, "KLA-Tencor Introduces Wafer Inspection and Review Systems," Silicon Semiconductor, Jul. 12, 2016.

(Continued)

*Primary Examiner* — Tri T Ton
(74) *Attorney, Agent, or Firm* — Hodgson Russ LLP (57) ABSTRACT

A review system and operation method directs a beam of light toward a sample on a stage. The sample is a wafer level packaging wafer or a backend wafer. Defect review is performed based on the light reflected from the sample. The review system can use one or more of: a fluid supplied by an immersion subsystem that includes a fluid supply unit and a fluid removal unit; an illumination pattern for differential phase contrast; or ultraviolet or deep ultraviolet wavelengths.

14 Claims, 3 Drawing Sheets

(56) References Cited

U.S. PATENT DOCUMENTS

| | | | |
|---|---|---|---|
| 10,563,973 B2* | 2/2020 | Li | G06T 7/0004 |
| 2002/0122174 A1* | 9/2002 | Hamamatsu | G01N 21/9501 |
| | | | 356/237.2 |
| 2004/0262529 A1* | 12/2004 | Yoshida | G01N 21/8806 |
| | | | 250/372 |
| 2005/0264802 A1 | 12/2005 | Shibata et al. | |
| 2007/0280526 A1 | 12/2007 | Malik et al. | |
| 2010/0219327 A1 | 9/2010 | Arbore et al. | |
| 2011/0141272 A1* | 6/2011 | Uto | G01N 21/9501 |
| | | | 348/135 |
| 2011/0164806 A1* | 7/2011 | Peleg | G01N 21/9501 |
| | | | 382/141 |
| 2012/0268738 A1* | 10/2012 | David | B24B 37/013 |
| | | | 356/326 |
| 2013/0228684 A1 | 9/2013 | Hatakeyama et al. | |
| 2018/0284032 A1* | 10/2018 | Ueyama | G01N 21/95684 |
| 2018/0374738 A1* | 12/2018 | Lee | H01L 21/67271 |
| 2019/0318948 A1* | 10/2019 | Che | H01L 21/67748 |

OTHER PUBLICATIONS

Chen et al., 3D Differential Phase Contrast Microscopy, Biomedial Optics Express, vol. 7, No. 10, 3940-3950, 2016.

Tian & Waller, Quantitative Differential Phase Contrast Imaging in an LED Array Microscope, Optics Express, vol. 23, No. 9, 11394, 2015.

WIPO, ISR for PCT/US2020/027881, dated Dec. 4, 2020.

Chen et al., 3D Differential Phase Contrast Microscopy, Quantitative Phase Imaging II, Proc. of SPIE, vol. 9718, 971826, 2016.

Vollrath, Ultra-High-Resolution DUV Microscope Optics for Semiconductor Applications, Proc. of SPIE 58650E, 2005.

Hillmann et al., DUV Water Immersion Technology Extends Linearity First Results from the New 65nm Node CD Metrology System LWM500 WI, 21st Euro. Mask and Lithography Conf., Proc. of SPIE, vol. 5835, 2005.

* cited by examiner

SYSTEMS AND METHODS OF HIGH-RESOLUTION REVIEW FOR SEMICONDUCTOR INSPECTION IN BACKEND AND WAFER LEVEL PACKAGING

FIELD OF THE DISCLOSURE

This disclosure relates to wafer defect review.

BACKGROUND OF THE DISCLOSURE

Evolution of the semiconductor manufacturing industry is placing greater demands on yield management. Critical dimensions continue to shrink, yet the industry needs to decrease time for achieving high-yield, high-value production. Minimizing the total time from detecting a yield problem to fixing it determines the return-on-investment for a semiconductor manufacturer.

Current review methods for backend and wafer level package (WLP) include using a dry, digitized optical microscope in visible, ultraviolet (UV), or deep ultraviolet (DUV) wavelength bands. While the design rule for such packages are at 5 µm or larger, the defect-of-interest (DOI) may be 2 µm or larger. Current systems having a high numerical aperture (NA) may be able to provide sufficient quality images for defect classification purposes.

As advanced WLP (aWLP) brings about industry motivation to continue Moore's Law, the design rule is shrinking to 1µm and the roadmap exists to 0.4 µm. For example, the defect size in such design rules may be 0.2 µm. The previously-mentioned review methods currently cannot, due to physical limitations of wavelength over NA (where NA is limited to be less than or equal to 1.0), provide the image quality needed for detection and classification purposes in such design rules. Furthermore, UV or DUV may damage the wafer, so the wavelength may be limited to the visible range.

Scanning electron microscopy (SEM), which is cost-inefficient and slow, may be used to detect and classify defects when current review methods are insufficient. However, SEM may not be usable for certain materials in aWLP or backend wafers when they are not compatible with vacuum due to degas or with an electrostatic chuck. Further, some specimens may be damaged under electron beam illumination in SEM. Finally, current SEM capabilities are slower and more expensive than optical review.

Therefore, improved optical review systems are needed.

BRIEF SUMMARY OF THE DISCLOSURE

A review system is provided in a first embodiment. The review system comprises a stage having the sample disposed thereon; a light source configured to emit a beam of light toward the sample; a detector configured to detect a portion of the beam of light reflected by the sample; a plurality of objectives; and a processor in electronic communication with the detector. The processor is configured to perform a review of defects on the sample. The sample is a wafer level packaging wafer or a backend wafer. Furthermore, the review system further includes an immersion subsystem that includes a fluid supply unit and a fluid removal unit; the light source includes a plurality of light-emitting diodes configured to form illumination patterns for differential phase contrast; and/or the light source includes a white light source that emits ultraviolet or deep ultraviolet wavelengths.

The light source can include the plurality of light-emitting diodes. The light-emitting diodes may be colored.

The light source can include a relay lens. The relay lens can be configured to image the beam of light reflected by the sample to the detector through at least one of the objectives. The detector can convert the light beam from the relay lens into an image using a frame grabber module. The frame grabber module can be synchronized with the stage.

The light source can be the white light source. The light source can further include a color filter and a spatial filter.

The processor can be further configured to generate an intensity image and a phase image. The intensity image and the phase image can be generated as a function of height. The processor can be further configured to generate a composite image from the intensity image and the phase image.

In an instance, the review system includes the immersion subsystem, the light source is the white light source, and the system includes the plurality of light-emitting diodes.

An inspection system can include the review system of the first embodiment.

A method is provided in a second embodiment. The method comprises directing a beam of light toward a sample on a stage. The sample is a wafer level packaging wafer or a backend wafer. The beam of light reflected from the sample is received at a detector. Using a processor, a review of defects on the sample is performed. One or more of the following also occurs. First, a fluid is supplied between the sample and an optical objective by an immersion subsystem that includes a fluid supply unit. Second, an illumination pattern is formed with the beam of light for differential phase contrast. Third, the beam of light is at ultraviolet or deep ultraviolet wavelengths.

The beam of light can be generated by a plurality of light-emitting diodes. The light-emitting diodes can be colored.

The method can include imaging the beam of light reflected by the sample through at least one objective to the detector using a relay lens. The beam of light from the relay lens can be converted into an image using a frame grabber module. The frame grabber module can be synchronized with the stage.

The light source can be the white light source. The light source further can include a color filter and a spatial filter.

The method can further include generating, using the processor, an intensity image and a phase image. The intensity image and the phase image are generated as a function of height. A composite image can be generated from the intensity image and the phase image.

In an instance, the method includes the supplying the fluid, forming the illumination pattern for the differential phase contrast, and the beam of light being at the ultraviolet or deep ultraviolet wavelengths.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

The systems and methods disclosed herein can provide review support for aWLP and BE applications. For samples of aWLP and BE wafers, embodiments can 1) apply immersion technology to review and classify defects, 2) apply differential phase contrast (DPC) technology to review and classify defects, 3) apply focus scan with DPC technology to review and classify defects, 4) apply polarization control to an illumination source and tube-lens with a quantitative modeling algorithm for DPC, or 5) use one or more of the techniques 1) through 4) with ultraviolet (UV) or deep ultraviolet (DUV) to review and classify defects. The system can be configured for different applications. For example, the system can combine DUV and immersion with DPC for one application, visible wavelength with immersion and DPC for another application, and visible wavelength with DPC and focus scan for yet another application. These different applications can be performed in the same review system.

Use of one or more of the techniques 1) through 4) may depend on the size and material of the defect and/or can involve a balance against the speed of performance. If the defect is large (e.g., 1 μm) and the material on wafer is DUV compatible, then DUV or immersion DUV may be used. If the defect size is large (e.g., 1 μm) and the material is UV/DUV incompatible, then immersion vis imaging can be used. If more resolution is needed, DPC may be needed, though this is slightly slower. For small defects (e.g., 0.4 μm), immersion DUV applied through focus scan DPC can be used. In general, for finding broken/short Cu-lines, DUV and immersion may be more useful. For organic defects on Cu lines/surfaces, the DPC and through focus scan may provide more value.

The semiconductor industry is moving into 2 μm. Previously, the defect size was approximately 2 μm to 5 μm, and a high NA dry optical microscope met the application requirements. More semiconductor manufacturers are moving move to 2 μm or less than 2 μm design rules. The embodiments disclosed herein can be used by semiconductor manufacturers that need improved throughput or cannot afford multiple scanning electron microscope steps for such defects.

Embodiments disclosed herein can be configured for the needs of a semiconductor manufacturer. Performance, speed, and cost can be balanced.

Figure 1:
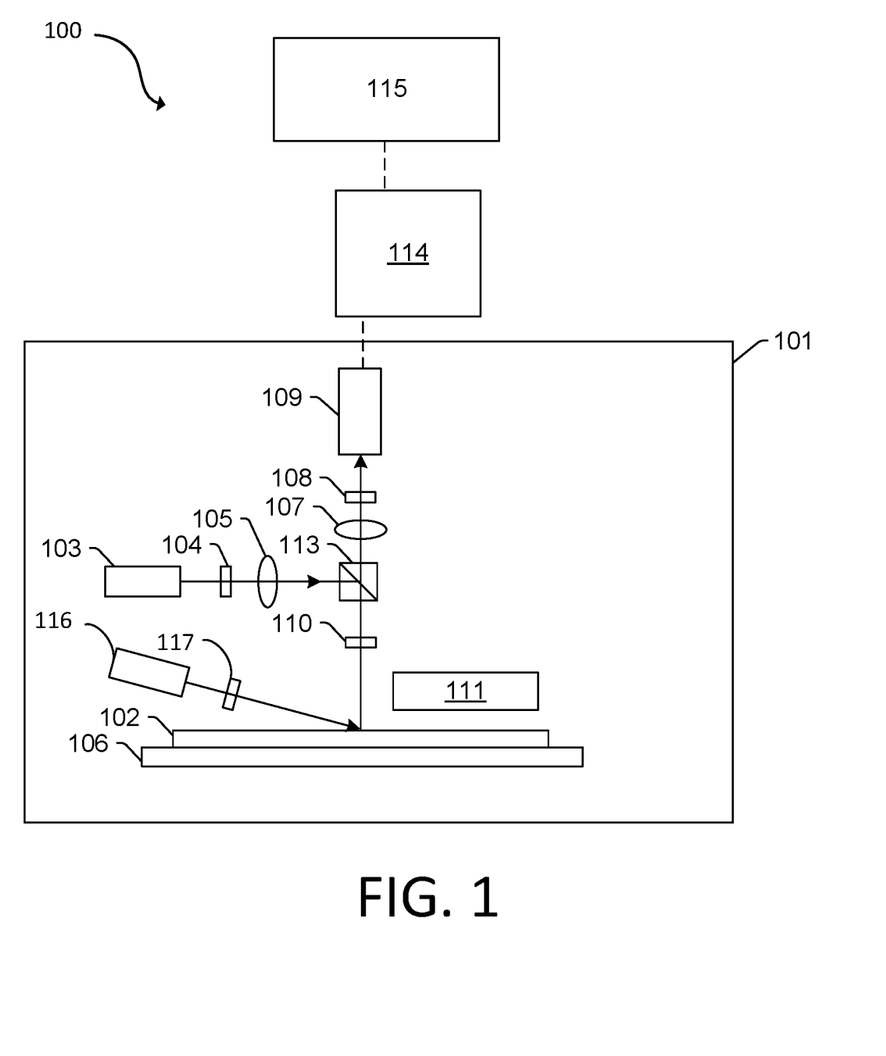
FIG. 1 illustrates an embodiment of a system in accordance with the present disclosure.

An embodiment of a system 100 is shown in FIG. 1. The system 100 includes optical based subsystem 101 (i.e., an optical review tool). In general, the optical based subsystem 101 is configured for generating optical based output for a sample 102 by directing light to (or scanning light over) and detecting light from the sample 102. In one embodiment, the sample 102 includes a wafer, constructed wafer, or wafers that are bonded. The wafer may include any wafer known in the art, such as an aWLP or BE wafer.

In the embodiment of the system 100 shown in FIG. 1, optical based subsystem 101 includes an illumination subsystem configured to direct light to sample 102. The illumination subsystem includes at least one light source. For example, as shown in FIG. 1, the illumination subsystem includes light source 103. In one embodiment, the illumination subsystem is configured to direct the light to the sample 102 at one or more angles of incidence, which may include one or more oblique angles and/or one or more normal angles. For example, as shown in FIG. 1, light from light source 103 is directed through optical element 104 and then lens 105 to sample 102 at an normal angle of incidence. The oblique angle of incidence may include any suitable oblique angle of incidence, which may vary depending on, for instance, characteristics of the sample 102.

The optical based subsystem 101 may be configured to direct the light to the sample 102 at different angles of incidence at different times. For example, the optical based subsystem 101 may be configured to alter one or more characteristics of one or more elements of the illumination subsystem such that the light can be directed to the sample 102 at an angle of incidence that is different from that shown in FIG. 1. In one such example, the optical based subsystem 101 may be configured to move light source 103, optical element 104, lens 105, and optical objective 110 such that the light is directed to the sample 102 at a different angle of incidence or an oblique (or near normal) angle of incidence.

An illumination beam at oblique angle of incident also can be done via outside of the objective lens 110, as shown with optional second light source 116.

A scan mechanism can change the distance between the sample 102 and objective lens 110. Various images or other data can be taken at a pre-determined position or positions.

In some instances, the optical based subsystem 101 may be configured to direct light to the sample 102 at more than one angle of incidence at the same time. For example, the illumination subsystem may include more than one illumination channel. One of the illumination channels may include light source 103, through optical element 104, and lens 105 as shown in FIG. 1 and another of the illumination channels (not shown) may include similar elements (or not similar lenses such as illuminating outside the objective lens 110), which may be configured differently (such as wavelength polarization) or the same, or may include at least a light source and possibly one or more other components such as those described further herein. If such light is directed to the specimen at the same time as the other light, one or more characteristics (e.g., wavelength, polarization, etc.) of the light directed to the sample 102 at different angles of incidence may be different such that light resulting from illumination of the sample 102 at the different angles of incidence can be discriminated from each other at the detector(s).

In another instance, the illumination subsystem may include only one light source (e.g., light source 103 shown in FIG. 1) and light from the light source may be separated into different optical paths (e.g., based on wavelength, polarization, etc.) by one or more optical elements (not shown) of the illumination subsystem. Light in each of the different optical paths may then be directed to the sample 102. Multiple illumination channels may be configured to direct light to the sample 102 at the same time or at different times (e.g., when different illumination channels are used to sequentially illuminate the specimen). In another instance, the same illumination channel may be configured to direct light to the sample 102 with different characteristics at different times. For example, in some instances, optical element 104 may be configured as a spectral filter and the properties of the spectral filter can be changed in a variety of different ways (e.g., by swapping out the spectral filter) such that different wavelengths of light can be directed to the sample 102 at different times. The illumination subsystem may have any other suitable configuration known in the art for directing the light having different or the same characteristics to the sample 102 at different or the same angles of incidence sequentially or simultaneously.

The system 100 also can include an optional second light source 116 and light conditioning optics 117. The second light source 116 can provide an oblique illumination channel.

As further shown in FIG. 1, the detection channel is shown positioned in the plane of the paper and the illumination subsystem is also shown positioned in the plane of the paper. Therefore, in this embodiment, the detection channel is positioned in (e.g., centered in) the plane of incidence. However, one or more of the detection channels may be positioned out of the plane of incidence.

As described further above, each of the detection channels included in the optical based subsystem 101 may be configured to detect scattered light. Therefore, the optical based subsystem 101 shown in FIG. 1 may be configured for dark field (DF) output generation for specimens 102. However, the optical based subsystem 101 may also or alternatively include detection channel(s) that are configured for bright field (BF) output generation for specimens 102. In other words, the optical based subsystem 101 may include at least one detection channel that is configured to detect light specularly reflected from the sample 102. Therefore, the optical based subsystems 101 described herein may be configured for only DF, only BF, or both DF and BF imaging. Although each of the collectors is shown in FIG. 1 as a single refractive optical element, it is to be understood that each of the collectors may include one or more refractive optical die(s) and/or one or more reflective optical element(s).

The detector 109 may include charge coupled devices (CCDs), time delay integration (TDI) cameras, and any other suitable detectors known in the art. The detector may also include non-imaging detectors or imaging detectors. In this manner, if the detectors with multiple detection channels are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the optical based subsystem may be signals or data, but not image signals or image data. In such instances, a processor such as processor 114 may be configured to generate images of the sample 102 from the non-imaging output of the detectors. However, in other instances, the detectors may be configured as imaging detectors that are configured to generate imaging signals or image data. Therefore, the optical based subsystem may be configured to generate optical images or other optical based output described herein in a number of ways.

The light source 103 may include any suitable light source. In an example, the light source 103 includes multiple light-emitting diodes (LEDs) configured to form an illumination pattern for DPC. In an example, the LEDs are in a 32×32 array with a discrete grid pattern. In another example, the LEDs are in a 4-8 ring shape with 16 LEDs in each ring. Each LED can be treated as a coherent point source. For example, the LEDs can be activated in a radius of a half-circle. The radius of the LED array can vary.

In another example, the light source 103 includes a white light source that emits from visible to UV and DUV wavelengths, such as Xe lamps. The light source 103 in this example also can be one or more LEDs. The light source 103 can further include a color filter and spatial filter. The white light source can provide DUV wavelengths. The color filter can be fixed in a wheel or can be a variable filter. The spatial filter can be programmable pin-holes or blinks.

There are UV LEDs that provide center wavelength around 355 nm or approximately 388 nm. Visible LEDs can be 435 nm, 530 nm and 635 nm. Other wavelengths are possible. Xe lamps with color filters may be used for DUV.

In yet another example, the light source 103 includes a plurality of LEDs. The LEDs in this example are colored.

The light source 103 also may include a polarized light source and/or a tube lens.

The optical based subsystem 101 can have multiple objectives. Some objectives work in dry conditions and other objectives work with immersion using various NA and field of view (FoV). The objectives can be changed or selected for a particular receipt using, for example, a motorized turret, which may be rotational or linear staged.

Light from optical element 104 may be focused onto sample 102 by lens 105. Although lens 105 is shown in FIG. 1 as a single refractive optical element, it is to be understood that, in practice, lens 105 may include a number of refractive and/or reflective optical elements that in combination focus the light from the optical element to the specimen. The illumination subsystem shown in FIG. 1 and described herein may include any other suitable optical elements (not shown). Examples of such optical elements include, but are not limited to, polarizing component(s), spectral filter(s), spatial filter(s), reflective optical element(s), apodizer(s), beam splitter(s) (such as beam splitter 113), aperture(s), and the like, which may include any such suitable optical elements known in the art. In addition, the optical based subsystem 101 may be configured to alter one or more of the elements of the illumination subsystem based on the type of illumination to be used for generating the optical based output.

The light from the optical element 104 can be imaged on the back focal plane of the objective.

When DPC is desired, the images of the light reflected from the sample 102 can be taken with pre-programmed illumination patterns.

When focus scan is desired, the images of the light reflected from the sample 102 are taken at different relative distance between the sample 102 and the objective 110.

In an instance, the light source 103 (or lens 105 of the illumination subsystem) includes a relay lens (e.g., a tube lens). The relay lens can be configured to image the beam of light reflected by the sample through at least one of the objectives to the detector 109, such as the objective 110.

The optical based subsystem 101 may also include a scanning subsystem configured to cause the light to be scanned over the sample 102. For example, the optical based subsystem 101 may include stage 106 on which sample 102 is disposed during optical based output generation. The scanning subsystem may include any suitable mechanical and/or robotic assembly (that includes stage 106) that can be configured to move the sample 102 such that the light can be scanned over the sample 102. In addition, or alternatively, the optical based subsystem 101 may be configured such that one or more optical elements of the optical based subsystem 101 perform some scanning of the light over the sample 102. The light may be scanned over the sample 102 in any suitable fashion such as in a serpentine-like path or in a spiral path.

In an embodiment, the optical based subsystem 101 includes an immersion subsystem 111, which can include a fluid supply unit and a fluid removal unit. A fluid is provided between the sample 102 and the optical objective 110. The fluid may have a refractive index higher than air. The fluid may be water, which has a refractive index of approximately 1.4, or another liquid compatible with the sample 102. For example, alcohol or oil may be used as the fluid. In an instance, the fluid has a refractive index greater than 1.5. By using the fluid, the equivalent NA is larger than 1.0, which can avoid UV or DUV light damage to the sample 102.

Little liquid may be needed to fill the gap that is approximately 1 mm or less than 1 mm. The liquid needs to be dried out after the measurement is done. Thus, the system is configured in a way such that there is a clean liquid supplier 118 to the gap (e.g., a needle or nozzle) and a liquid remover 119 (e.g., a vacuum). Additional details are disclosed in U.S. Pat. No. 7,436,527, which is incorporated by reference in its entirety.

Figure 2:
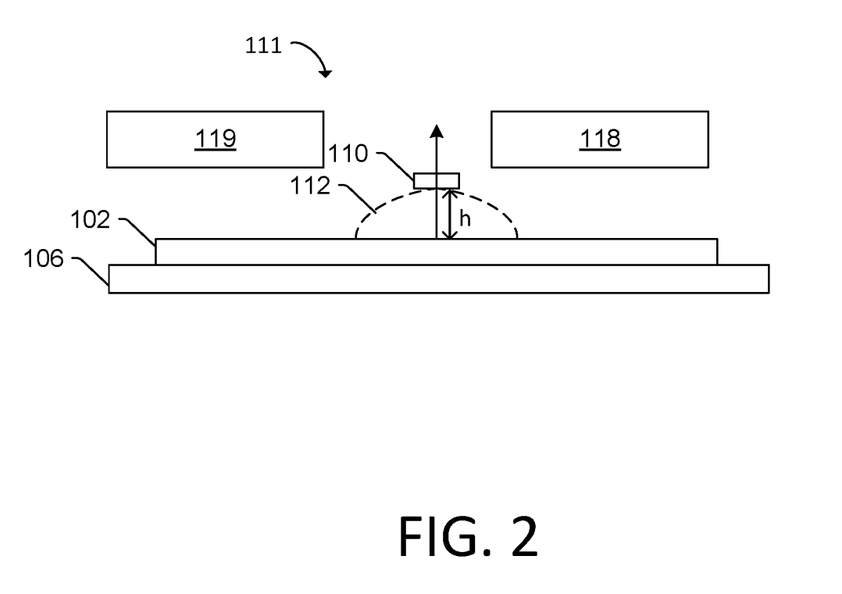
FIG. 2 illustrates a further embodiment of a system in accordance with the present disclosure.

The gap may be the separation distance h depicted in FIG. 2 between the end surface of the optical objective 110 and the surface of the sample 102. The gap may be an air gap or vacuum. In FIG. 2, the fluid 112 occupies the gap between the optical objective 110 and the sample 102. The gap between the optical objective 110 and the sample 102 may be completely filled with air or liquid.

In an instance, the fluid is contained in the fluid supply unit of the immersion subsystem 111. The fluid can be pumped to a bottom surface of optical objective 110. Fluid can be is forced through into the volume between the optical objective 110 and the sample 102 using the liquid supplier 118. Residual fluid can be dried off with the liquid remover 119. The liquid can return to the immersion subsystem 111. Therefore, the system is configured to generate flow of the liquid between the surfaces of the optical objective 110 and the sample 102 during review. Additional details are disclosed in U.S. Pat. No. 7,130,037, which is incorporated by reference in its entirety.

With the immersion subsystem 111, the light source 103 can include a plurality of light-emitting diodes. The light source 103 can be a white light source.

It is noted that FIG. 1 is provided herein to generally illustrate a configuration of an optical based subsystem 101 that may be included in the system embodiments described herein or that may generate optical based output that is used by the system embodiments described herein. The optical based subsystem 101 configuration described herein may be altered to optimize the performance of the optical based subsystem 101 as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

The processor 114 may be coupled to the components of the system 100 in any suitable manner (e.g., by one or more transmission media, which may include wired and/or wireless transmission media) such that the processor 114 can receive output. The processor 114 may be configured to perform a number of functions using the output. The system 100 can receive instructions or other information from the processor 114. The processor 114 and/or the electronic data storage unit 115 optionally may be in electronic communication with a wafer inspection tool, a wafer metrology tool, or a wafer review tool (not illustrated) to receive additional information or send instructions. For example, the processor 114 and/or the electronic data storage unit 115 can be in electronic communication with an SEM. In another instance, the system 100 is part of an inspection system.

The processor 114 can be configured to generate an intensity image and a phase image. The intensity image and the phase image can be generated as a function of height.

For this purpose, one will take multiple of images with different illumination conditions (e.g., LEDs in right half of a ring, left half, upper half and lower half, inner rings only, outer rings only, etc.) An algorithm can use those images as input, and after all the data processed via the algorithm, intensity and phase images can be generated.

The processor 114 can be further configured to generate a composite image from the intensity image and the phase image. This can be performed with additional images with different relative distance between the sample and objective lens.

Using the processor 114, phase imaging can be performed with intensity image using DPC. The phase image can improve the image quality using phase-contrast and partial coherence illumination. Separately taking the phase and intensity images can be performed. The phase information can assist with review of thin transparent materials, such as photoresist, polybenzoxazole (PBO), or the like, on a metal used for aWLP or BE like copper. Two images can be captured to implement DPC with an array of LEDs: one with a half circle of LEDs on and one with the other half circle on. The array can be circular or another pattern that enables the two half circle activation regions. The two images can be used to compute the phase contrast image. Quantitative phase can be recovered by deconvolving the DPC image using the calculated transfer function. Because of the flexible patterning of the LED array, DPC measurements can be implemented in real-time and along arbitrary axes of asymmetry with a minimal number of mechanical parts.

A focus scan with DPC-configuration can provide height information of the structure on the sample 102 under review. The height information improves the images quality due to defocus because results of structure height on sample are often taller than the depth of focus of the high NA objective. The height information also can provide method to measure the height of the features on the sample 102, taking advantages of the high NA by, for example, immersion and/or short wavelengths. 2D intensity is typically measured in a single image. The sample 102 can be scanned and images can be captured at many focus planes to build up a 3D intensity measurement.

DPC microscopy can use asymmetric illumination for phase contrast. For example, four images can be captured with rotated half-circle source patterns. The dynamic source switching is achieved using, for example, a programmable LED array.

Polarization control can be performed on the light source 102 and tube-lens. In a high NA system (in benefit of spatial resolution), the focused light can no longer be treated as scale waves, but its vector property may need to be considered per electromagnetic wave theory. The vector characteristics of light is not considered in references of DPC where quantitative modeling of light propagation may be required. So polarization of light may need to be controlled in the system and/or modelled in DPC algorithm.

In an instance with a relay lens, the detector 109 converts the light beam from the relay lens into an image using a frame grabber module, which may be part of or run on the processor 114. The frame grabber module can be synchronized with movement of the stage 106 or a scan lens. Digitized images from the frame grabber can be stored in the electronic data storage unit 115. In an instance, the detector 109 converts the light from a relay lens into digitized images using the frame grabber.

The processor 114, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor, CPU, or GPU. In addition, the subsystem(s) or system(s) may include a platform with high-speed processing and software, either as a standalone or a networked tool.

The processor 114 and electronic data storage unit 115 may be disposed in or otherwise part of the system 100 or another device. In an example, the processor 114 and electronic data storage unit 115 may be part of a standalone control unit or in a centralized quality control unit. Multiple processors 114 or electronic data storage units 115 may be used.

The processor 114 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 114 to implement various methods and functions may be stored in readable storage media, such as a memory in the electronic data storage unit 115 or other memory.

If the system 100 includes more than one processor 114, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 114 may be configured to perform a number of functions using the output of the system 100 or other output. For instance, the processor 114 may be configured to send the output to an electronic data storage unit 115 or another storage medium. The processor 114 may be further configured as described herein.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 114 may be configured according to any of the embodiments described herein. The processor 114 also may be configured to perform other functions or additional steps using the output of the system 100 or using images or data from other sources.

The processor 114 can analyze the images when all desired images are generated. The output of the analysis can be an intensity image and a phase image, which may be as function of heights. The results can be further processed, for example, to make a composite image. The analyzed results can be stored for documentation (such as in the electronic data storage unit 115), fed into other algorithms for training (such as to train a deep learning module for classifying defects), and/or displayed for a user.

Various steps, functions, and/or operations of system 100 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 114 or, alternatively, multiple processors 114. Moreover, different subsystems of the system 100 may include one or more computing or logic systems. Therefore, the above description should not be interpreted as a limitation on the present disclosure but merely an illustration.

The system 100 can provide high enough resolution for aWLP and BE sample, such as silicon vias, through-silicon via (TSV), copper micro-bumps, or contact pads. Other samples can be in a redistribution layer (RDL) on substrate (e.g., glass, blank Si wafer, or wafer with function dies typically). If multiple layers are made, each layer has Cu for conductivity, and isolation material such as PBO or polyimide (PI). The system 100 is flexible for different samples. The system 100 also can mitigate UV/DUV damage to the sample, is non-destructive, and avoids complications for vacuum compatibility.

Figure 3:
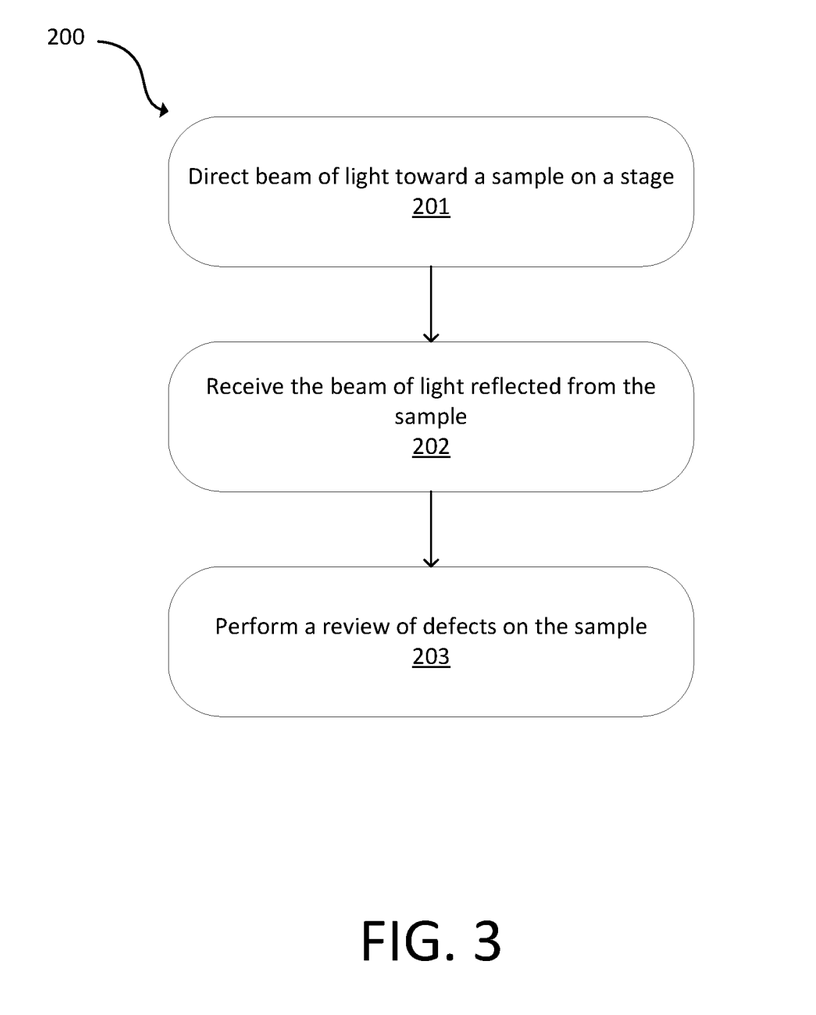
FIG. 3 illustrates an embodiment of a method in accordance with the present disclosure.

FIG. 3 illustrates an embodiment of a method 200. The method 200 includes directing a beam of light toward a sample on a stage at 201. The sample is an aWLP wafer or a BE wafer. The beam of light reflected from the sample is received at a detector at 202. A review of defects on the sample is performed at 203 using information from the detector.

The method 200 includes at least one of: supplying a fluid between the sample and an optical objective by an immersion subsystem that includes a fluid supply unit; forming an illumination pattern for differential phase contrast with the beam of light; or the beam of light being at ultraviolet or deep ultraviolet wavelengths.

In an instance of the method 200, the beam of light is generated by a plurality of LEDs. The LEDs may be colored.

In an instance of the method 200, the beam of light reflected by the sample is imaged through at least one of the objectives to the detector using a relay lens. The beam of light from the relay lens can be converted into an image using a frame grabber module of the detector. The frame grabber module can be synchronized with the stage.

In an instance of the method 200, the light source is the white light source. The light source further includes a color filter and a spatial filter.

In an instance, the method 200 includes generating, using the processor, an intensity image and a phase image. The intensity image and the phase image are generated as a function of height. The method 200 can further include generating, using the processor, a composite image from the intensity image and the phase image.

In an instance, the method 200 includes supplying the fluid, the beam of light forms the illumination pattern for the differential phase contrast, and the beam of light is at the ultraviolet or deep ultraviolet wavelengths.

The embodiments described herein can be used for review and/or classification of defects on samples in an aWLP or BE. Immersion technology to review and classify defects, DPC technology to review and classify defects, focus scan with DPC technology to review and classify defects, polarization control to an illumination source and tube-lens with a quantitative modeling algorithm for DPC, or use one or more of these techniques with UV or DUV to review and classify defects can improve review and/or classification of defects on samples in a aWLP or BE.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A review system comprising:
   a stage having the sample disposed thereon, wherein the sample is a wafer level packaging wafer or a backend wafer;
   a light source configured to emit a beam of light toward the sample, wherein the light source includes a white light source that emits an ultraviolet or deep ultraviolet wavelength, and wherein the light source comprises a relay lens;
   a detector configured to detect a portion of the beam of light reflected by the sample;
   a plurality of objectives, wherein the relay lens is configured to image the beam of light reflected by the sample to the detector through at least one of the objectives, wherein the detector converts the light beam from the relay lens into an image using a frame grabber module, and wherein the frame grabber module is synchronized with the stage;
   an immersion subsystem that includes a liquid supplier and a liquid remover, wherein the immersion subsystem is configured to provide a liquid from the liquid supplier between one of the objectives and the sample; and
   a processor in electronic communication with the detector, wherein the processor is configured to perform a review of defects on the sample.

2. The review system of claim 1, wherein the light source includes a plurality of light-emitting diodes configured to form illumination patterns for differential phase contrast, and wherein the light-emitting diodes are colored.

3. The review system of claim 1, wherein the light source further includes a color filter and a spatial filter.

4. The review system of claim 1, wherein the processor is further configured to generate an intensity image and a phase image, wherein the intensity image and the phase image are generated as a function of height.

5. The review system of claim 4, wherein the processor is further configured to generate a composite image from the intensity image and the phase image.

6. The review system of claim 1, wherein the system includes a plurality of light-emitting diodes.

7. An inspection system that comprises the review system of claim 1.

8. A method comprising:
   directing a beam of light toward a sample on a stage, wherein the sample is a wafer level packaging wafer or a backend wafer, and the beam of light is at an ultraviolet or deep ultraviolet wavelength;
   supplying a liquid between the sample and an optical objective by an immersion subsystem that includes a liquid supplier;
   receiving the beam of light reflected from the sample at a detector;
   imaging the beam of light reflected by the sample through at least one objective to the detector using a relay lens;
   converting the beam of light from the relay lens into an image using a frame grabber module, wherein the frame grabber module is synchronized with the stage; and performing, using a processor, a review of defects on the sample.

9. The method of claim 8, wherein the beam of light is generated by a plurality of light-emitting diodes, and wherein the light-emitting diodes are colored.

10. The method of claim 8, wherein the light source is a white light source, and wherein the light source further includes a color filter and a spatial filter.

11. The method of claim 8, wherein further comprising generating, using the processor, an intensity image and a phase image, wherein the intensity image and the phase image are generated as a function of height.

12. The method of claim 11, generating, using the processor, a composite image from the intensity image and the phase image.

13. The method of claim 8, wherein the method includes forming an illumination pattern with the beam of light for differential phase contrast.

14. The method of claim 8, wherein the liquid has a refractive index equal to or greater than that of water.

* * * * *